United States Patent
Lee et al.

(10) Patent No.: US 9,831,194 B1
(45) Date of Patent: Nov. 28, 2017

(54) EDGE COMPRESSION LAYERS

(71) Applicant: GLOBALFOUNDRIES Inc., Grand Cayman (KY)

(72) Inventors: Tom C. Lee, Essex Junction, VT (US); Cathryn J. Christiansen, Huntington, VT (US); Ian A. McCallum-Cook, Burlington, VT (US); Anthony K. Stamper, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/203,326

(22) Filed: Jul. 6, 2016

(51) Int. Cl.
*H01L 23/00* (2006.01)
*H01L 23/544* (2006.01)
*H01L 21/78* (2006.01)

(52) U.S. Cl.
CPC ............ *H01L 23/562* (2013.01); *H01L 21/78* (2013.01); *H01L 23/544* (2013.01); *H01L 2223/5446* (2013.01)

(58) Field of Classification Search
CPC .................................................. H01L 23/562
See application file for complete search history.

(56) References Cited

U.S. PATENT DOCUMENTS

| | | | |
|---|---|---|---|
| 5,071,714 A | | 12/1991 | Rodbell et al. |
| 6,492,247 B1 * | | 12/2002 | Guthrie ............... H01L 21/78 257/639 |
| 7,109,093 B2 | | 9/2006 | Fitzsimmons et al. |
| 7,335,577 B2 | | 2/2008 | Daubenspeck et al. |
| 7,521,336 B2 | | 4/2009 | Daubenspeck et al. |
| 7,572,738 B2 | | 8/2009 | Nogami |
| 7,573,130 B1 | | 8/2009 | Shaw et al. |
| 8,610,238 B2 | | 12/2013 | Kaltalioglu et al. |
| 2015/0108645 A1 * | | 4/2015 | Daubenspeck ... H01L 21/76802 257/751 |

* cited by examiner

*Primary Examiner* — William Harriston
(74) *Attorney, Agent, or Firm* — Thompson Hine LLP; Anthony Canale

(57) ABSTRACT

Structures for a chip, as well as methods of fabricating such chip structures. The chip including a portion of a substrate, an active circuit region associated with the portion of the substrate, an interconnect structure on the active circuit region, and a crackstop extending through the interconnect structure. A groove extends through the interconnect structure to the substrate at a location exterior of the crackstop. A stress-containing layer is formed on at least a portion of the groove.

20 Claims, 1 Drawing Sheet

EDGE COMPRESSION LAYERS

BACKGROUND

The present invention relates to semiconductor device fabrication and integrated circuits and, more specifically, to structures for a chip, as well as methods of fabricating such chip structures.

A wafer may be processed by front-end-of-line processing to fabricate a plurality of substantially identical chips. Among other factors, the number of chips yielded from the wafer is a function of the individual chip size, as well as the wafer size. Each chip or die includes integrated circuits formed by the front-end-of-line processing, a local interconnect level formed by middle-end-of-line processing, and stacked metallization levels of an interconnect structure formed by back-end-of line processing. Dicing channels are present between the chips and are used during a dicing process to singulate the chips. The dicing process may induce stress into the chips, which may initiate stress cracks that can propagate into the active circuit area and lead to chip failures. After singulation from the wafer, chips may be packaged and mounted on a substrate, such as a circuit board or a laminate.

Improved structures and fabrication methods are needed that address crack formation and propagation.

SUMMARY

According to an embodiment, a structure is provided that includes a chip including a portion of a substrate, an active circuit region associated with the portion of the substrate, an interconnect structure on the active circuit region, and a crackstop extending through the interconnect structure. The structure further includes a groove extending through the interconnect structure to the substrate at a location exterior of the crackstop, and a stress-containing layer located on at least a portion of the groove.

According to another embodiment, a method includes forming a groove extending through an interconnect structure on a chip at a location exterior of a crackstop in the interconnect structure. A stress-containing layer is formed on at least a portion of the groove.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
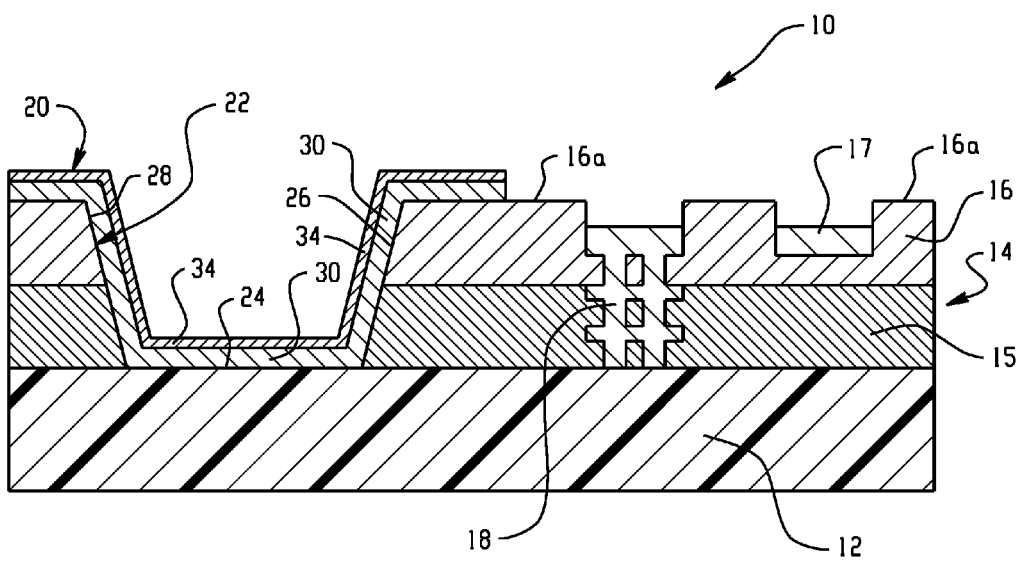
FIG. 1 is a cross-sectional view of a structure at a fabrication stage of a processing method in accordance with an embodiment of the invention.

With reference to FIG. 1 and in accordance with an embodiment of the invention, a chip 10 may be formed using a substrate 12 may be a bulk wafer or a semiconductor-on-insulator (SOI) wafer. During front-end-of-line (FEOL) processing, device structures of integrated circuits are fabricated using the substrate 12 to form an active circuit region of a chip 10. The device structures of the integrated circuit may comprise device types such as planar and/or non-planar field-effect transistors, bipolar junction transistors, etc.

Back-end-of-line (BEOL) processing follows to fabricate an interconnect structure, generally indicated by reference numeral 14, connecting the device structures to form the desired integrated circuits of the chip 10. The interconnect structure 14 may be comprised of wiring layers coupled with the device structures and may include as many as eight or more wiring layers that supply conductive paths for signals, clock, power, etc. Passive circuit elements, such as diodes, fuses, anti-fuses, resistors, capacitors, varactors, and inductors, may be integrated into the interconnect structure 14.

The wiring layers of the interconnect structure 14 may be formed by deposition, polishing, lithography, and etching techniques characteristic of damascene processes. Specifically, for each wiring layer, interlayer dielectric layers 15 may be successively deposited and patterned using lithography and etching to form via openings and/or trenches that are lined with a liner (e.g., a bilayer of tantalum and tantalum nitride) and filled by a planarized conductor (e.g., copper). Each interlayer dielectric layer 15 may be comprised of any suitable organic or inorganic dielectric material, such as hydrogen-enriched silicon oxycarbide (SiCOH) or another type of low-k dielectric material that may be deposited by, for example, chemical vapor deposition (CVD).

Dielectric layers 16 may be formed on a top surface of the uppermost interlayer dielectric layer 15. The dielectric layers 16 may include a layer of silicon dioxide ($SiO_2$) and a layer of silicon nitride ($Si_3N_4$) deposited by, for example, CVD. Wiring, including bond pads 17, is formed in the dielectric layers 16 in order to define a topmost wiring layer of the interconnect structure 14. The dielectric layers 16 may further include a topmost passivation layer comprised of an organic material, such as a polymer like polyimide, that is also an electrical insulator.

Concurrent with the formation of the wiring, a crackstop 18 may be formed in the metallization levels of the interconnect structure 14 at a location proximate to the peripheral edges of the chip 10. The crackstop 18 includes stacked conductive wires and vias formed as metallization embedded in the interlayer dielectric layers 15 and the dielectric layers 16 in conjunction with the formation of the different wiring layers. The crackstop 18 extends vertically from the substrate 12 to the top surface 16a of the dielectric layers 16 of the interconnect structure 14, and extends horizontally about the perimeter of the chip 10. Additional crackstops (not shown) may be formed in the interconnect structure 14 and located adjacent to the crackstop 18 at the peripheral edges of the chip 10. The active circuit region of the chip 10 is located interior of the peripheral edges of the chip 10 and interior of the crackstop 18. The bond pad 17 may be coupled with the active circuit region of the chip 10.

Additional chips are formed using the wafer in parallel with chip 10, and may have a similar construction. Dicing channels, such as the representative dicing channel 20, are formed in a kerf region of the substrate 12 located between adjacent chips. The dicing channels are spaced apart in two directions and cross in a grid-like manner at right angles across the substrate 12. The dicing channel 20 is located adjacent to one side edge of the chip 10, and a dicing channel like the dicing channel 20 is located adjacent to each of the other side edges of the chip 10. The dicing channel 20 is reserved as a cutting lane or dead space in the kerf region that permits the chip 10 to be singulated from adjacent chips without inflicting damage to the active circuit region of the chip 10. Sacrificial structures, such as test monitor devices for wafer level testing and alignment markings, may be located in the dicing channel 20. A dicing saw or a laser apparatus may be used to cut or scribe the substrate 12 along the dicing channel 20 and thereby physically singulate the chips 10.

The crackstop 18 is located between the dicing channel 20 and the active circuit region of the chip 10. The crackstop 18 functions to mitigate the propagation of cracks, which may be initiated by chipping and cracking formed along the peripheral edges of the chip 10 during the dicing operation involving the dicing channel 20, into the active circuit region of the chip 10.

A groove 22 may be located in the kerf between the dicing channel 20 and the crackstop 18. The groove 22 is a trench formed by patterning with photolithography and etching processes. The groove 22 may extend about the entire perimeter of the chip 10 and surround the active circuit region of the chip 10. The groove 22 may extend vertically through all of the metallization levels of the interconnect structure 14 to the substrate 12.

The groove 22 includes a surface 24 that may be contained in a plane that is parallel to a plane in which the top surface 16a of the dielectric layers 16 is contained. The groove 22 further includes a surface 26, which is inclined relative to surface 24 in the representative embodiment, that extends from the surface 24 to the top surface 16a of the dielectric layers 16. The groove 22 further includes a surface 28, which is inclined in the representative embodiment relative to surface 24, that extends from surface 24 to the top surface of the dicing channel 20. The surface 24 is laterally located between surfaces 16a, 26 and surface 28.

A layer 30 is formed with a given thickness on least the surfaces 24, 26 and is comprised of a material that incorporates internal stress. Along surface 24, the layer 30 is in direct contact with the interlayer dielectric layers 15 and the dielectric layers 16 of the interconnect structure 14. The layer 30 may also be formed, at least in part, on the top surface 16a of the dielectric layers 16. The layer 30 may be removed by patterning using photolithography and etching processes from areas other than the surfaces 24, 26 and the top surface 16a of the dielectric layers 16 adjacent to the groove 22. While the layer 30 is shown in the representative embodiment as applied to surface 28 and the dicing channel 20, the layer 30 in these areas may be removed when the layer 30 is patterned. The layer 30 does not extend past the crackstop 18 and into the active circuit region of the chip 10, which is located to the interior of the crackstop 18. Before the layer 30 is formed, any topmost passivation layer among the dielectric layers 16 may be removed from the surfaces on which the layer 30 is to be subsequently applied.

In an embodiment, the stress incorporated into the material of the layer 30 may be compressive stress, and the magnitude of the compressive stress may be in a range of −100 (Mega-pascals) MPa to −1000 MPa. The stress is transferred from the layer 30 into the underlying substrate 12 at surface 24 and into the underlying chip 10 at surfaces 16a, 26. In an embodiment, the layer 30 may be comprised of titanium nitride (TiN) deposited by physical vapor deposition (PVD) or another deposition technique, and that includes compressive stress in its as-deposited condition that persists until, at the least, after the chip 10 is singulated using the dicing channel 20. The layer 30 may further include one or more additional layers that may include compressive stress in its as-deposited condition and/or one or more additional layers that include tensile stress. For example, the layer 30 may be comprised of a bi-layer of titanium nitride (TiN) in combination with a layer of titanium (Ti). In the aggregate, the stresses in a layer combination should provide a net compressive stress (i.e., the compressive stress is greater than the tensile stress) for transfer to the chip 10.

The stress imparted by layer 30 may be effective in reducing the probability that a crack can initiate during dicing or assembly, and then propagate into the active circuit area of the chip 10. The stress imparted by the layer 30 may function to neutralize any pre-existing cracks such that a critical crack length is not exceeded. A benefit attributable to the stress imparted by the layer 30 may be that the number of crackstops may be reduced at the periphery of the chip 10. While only the representative embodiment includes only a single crackstop 18 in the construction, additional crackstops may be included as mentioned supra. The stress imparted by layer 30 also pins the edge of the interconnect structure 14 at the groove 22 such that the likelihood of delamination between the wiring layers of the interconnect structure 14 may be reduced.

An edge seal layer 34 may be applied to at least the surfaces 24, 26 of the groove 22, and may function as a moisture barrier. In an embodiment, the edge seal layer 34 may be comprised of silicon nitride deposited by CVD. In another embodiment, the edge seal layer 34 may be comprised of silicon dioxide deposited by plasma-enhanced chemical vapor deposition (PECVD). The edge seal layer 34 may be applied either before or after the layer 30 is applied. The edge seal layer 34 may contribute compressive stress that complements the compressive stress applied by the layer 30. Alternatively, the edge seal layer 34 may be omitted from the construction.

In an alternative embodiment, the layer 30 may be comprised of a piezoelectric material. Candidate piezoelectric materials include, but are not limited to, quartz (crystalline $SiO_2$) or a perovskite $ABX_3$ crystal, such as barium titanate ($BaTiO_3$) or lead zirconate titanate (PZT). The piezoelectric material constituting the layer 30 may be biased during laser scribe/dicing operations to improve yield and to reduce latent damage. In addition, biasing the piezoelectric material of the layer 30 during operation of the chip 10 may improve reliability.

Figure 2:
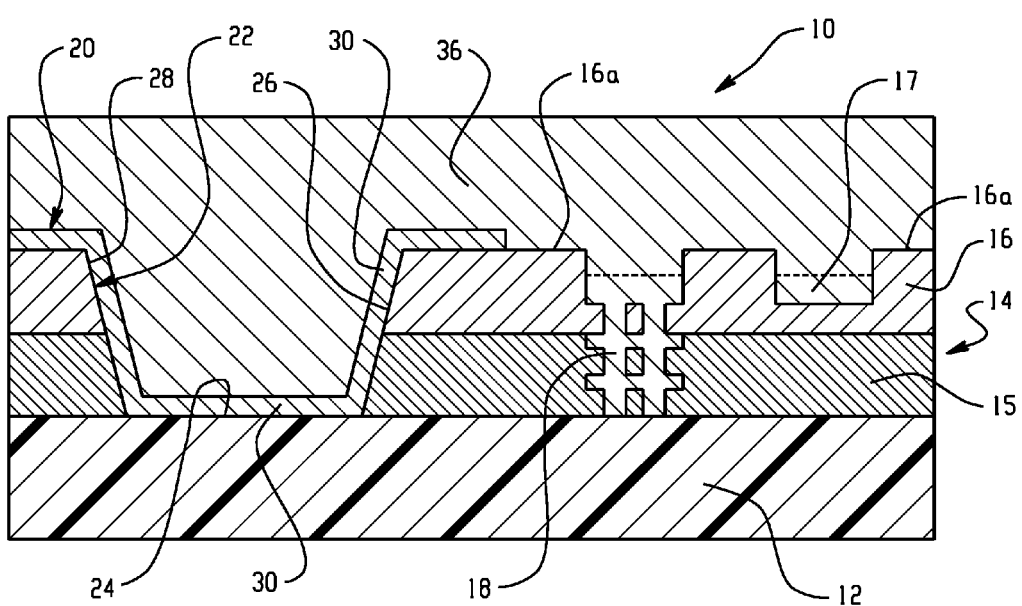
FIG. 2 is a cross-sectional view of a structure at a fabrication stage of a processing method in accordance with an alternative embodiment of the invention.

With reference to FIG. 2 in which like reference numerals refer to like features in FIG. 1 and in accordance with an alternative embodiment, the layer 30 may be comprised of a material that has experienced a phase transformation. The phase transformation may effective to generate or increase the internal stress in the layer 30.

In an embodiment, the material of layer 30 may be titanium tri-aluminide ($TiAl_3$) formed from a titanium-containing layer that is applied to the surfaces 16a, 24, 26. The titanium-containing layer may be constituted by titanium, titanium nitride, or a layered combination of these and other materials with or without titanium content, and may be deposited by PVD or another deposition technique. A layer 36 that includes copper and aluminum is deposited in the groove 22. The layer 36 may be composed of material from the same layer that is used to form the bond pad 17 and at least the uppermost level of the crackstop 18. In an embodiment, the layer 36 may be composed of a copper-aluminum (Cu—Al) alloy. The layer 36 may be in contact with, or in proximity to, the titanium-containing layer such that a reaction can be induced with the titanium-containing layer to transform the titanium-containing layer into the layer 30.

With the layer 36 present and in proximity to or contact with the titanium-containing layer, a thermal anneal may be performed at a temperature and for a duration that causes aluminum atoms from the layer 36 to combine with the titanium in the titanium-containing layer and converts the titanium in the titanium-containing layer to the titanium tri-aluminide of layer 30. The final level of internal stress contained in the layer 30 is attributable to this phase transformation. Exemplary temperature and time parameters for a typical anneal may be 400° C. for 1 hour. In an embodiment, the titanium-containing layer may contain compressive stress when applied and the thermal anneal may be used to increase the compressive stress in layer 30 above its initial level. For example, the titanium-containing layer may incorporate stress at an initial level when applied to the groove 22, and the layer 30 of titanium tri-aluminide formed by the thermal anneal may include compressive stress at a level that is greater than the initial level. Alternatively, the titanium-containing layer may contain tensile stress or no stress (i.e., stress free) when applied to the groove 22, and the thermal anneal may be used to create the compressive stress in layer 30. Residual amounts of the layer 36 in the groove 22 may be removed from the groove 22 or, alternatively, may be left in the groove 22.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a chip including a portion of a substrate, an active circuit region associated with the portion of the substrate, an interconnect structure on the active circuit region, and a crackstop extending through the interconnect structure, the interconnect structure including a dielectric layer having a top surface;
   a groove extending through the interconnect structure toward the substrate at a location exterior of the crackstop, the groove including a first surface located at the substrate and a second surface that extends from the first surface to the top surface of the dielectric layer; and
   a stress-containing layer located on the first surface and the second surface of the groove.

2. The structure of claim 1 wherein the stress-containing layer is comprised of titanium tri-aluminide.

3. The structure of claim 1 wherein the stress-containing layer is further located on the top surface of the dielectric layer between the crackstop and the groove.

4. The structure of claim 1 wherein the second surface borders the interconnect structure of the chip, the stress-containing layer directly contacts the interconnect structure along the second surface, and the stress-containing layer transfers stress to the interconnect structure.

5. A structure comprising:
   a chip including a portion of a substrate, an active circuit region associated with the portion of the substrate, an interconnect structure on the active circuit region, and a crackstop extending through the interconnect structure;
   a groove extending through the interconnect structure toward the substrate at a location exterior of the crackstop; and
   a stress-containing layer located on at least a portion of the groove,
   wherein the stress-containing layer is comprised of titanium tri-aluminide.

6. The structure of claim 1 wherein the stress-containing layer is comprised of a material that is a product of a phase transformation.

7. The structure of claim 1 further comprising:
   an edge seal layer located on the stress-containing layer or located between the stress-containing layer and the groove.

8. The structure of claim 7 wherein the edge seal layer is formed of a stress-containing material.

9. The structure of claim 7 wherein the edge seal layer is located on the stress-containing layer.

10. The structure of claim 1 wherein the stress-containing layer internally incorporates compressive stress, and the compressive stress is transferred from the stress-containing layer to the interconnect structure.

11. The structure of claim 7 wherein the edge seal layer is located between the stress-containing layer and the groove.

12. A method comprising:
   forming a groove extending through an interconnect structure on a chip at a location exterior of a crackstop in the interconnect structure; and
   forming a stress-containing layer on at least a portion of the groove,
   wherein the interconnect structure includes a dielectric layer having a top surface, the interconnect structure is located on a portion of a substrate that is associated with an active circuit region, the groove includes a first surface located at the substrate and a second surface that extends from the first surface to the top surface of the dielectric layer, and the stress-containing layer is formed on the first surface and the second surface.

13. The method of claim 12 wherein the stress-containing layer is further formed on the top surface of the dielectric layer between the crackstop and the groove.

14. The method of claim 12 wherein the second surface borders the interconnect structure of the chip, the stress-containing layer directly contacts the interconnect structure along the second surface, and the stress-containing layer transfers stress to the interconnect structure.

15. The method of claim 12 wherein forming the stress-containing layer on at least the portion of the groove comprises:
    depositing a titanium-containing layer on at least the portion of the groove;
    depositing an aluminum-containing layer on the titanium-containing layer; and
    annealing to cause aluminum atoms from the aluminum-containing layer to combine with the titanium-containing layer to form titanium tri-aluminide as the stress-containing layer.

16. The method of claim 12 wherein the stress-containing layer is comprised of a material that is a product of a phase transformation.

17. The method of claim 12 further comprising:
    forming an edge seal layer formed on the stress-containing layer or formed between the stress-containing layer and the groove.

18. The method of claim 17 wherein the edge seal layer is formed of a stress-containing material.

19. The method of claim 17 wherein the edge seal layer is formed on the stress-containing layer.

20. The method of claim 12 wherein the stress-containing layer internally incorporates compressive stress, and the compressive stress is transferred from the stress-containing layer to the interconnect structure.

* * * * *